United States Patent
Gondaira et al.

(10) Patent No.: US 10,627,716 B2
(45) Date of Patent: Apr. 21, 2020

(54) PHOTOSENSITIVE RESIN COMPOSITION, SOLDER RESIST FILM USING SAID PHOTOSENSITIVE RESIN COMPOSITION, FLEXIBLE PRINTED CIRCUIT AND IMAGE DISPLAY DEVICE

(71) Applicant: ARISAWA MFG. CO., LTD., Joetsu-shi, Niigata (JP)

(72) Inventors: Takashi Gondaira, Joetsu (JP); Makoto Tai, Joetsu (JP)

(73) Assignee: ARISAWA MFG. CO., LTD., Joetsu-shi, Niigata (JP)

( * ) Notice: Subject to any disclaimer, the term of this patent is extended or adjusted under 35 U.S.C. 154(b) by 0 days.

(21) Appl. No.: 16/483,547

(22) PCT Filed: Feb. 28, 2017

(86) PCT No.: PCT/JP2017/007954
§ 371 (c)(1),
(2) Date: Aug. 5, 2019

(87) PCT Pub. No.: WO2018/146821
PCT Pub. Date: Aug. 16, 2018

(65) Prior Publication Data
US 2020/0026186 A1    Jan. 23, 2020

(30) Foreign Application Priority Data

Feb. 7, 2017   (JP) .................................. 2017-020628

(51) Int. Cl.
| | | |
|---|---|---|
| *H05K 1/03* | (2006.01) | |
| *G03F 7/029* | (2006.01) | |
| *G03F 7/039* | (2006.01) | |
| *G03F 7/038* | (2006.01) | |
| *H05K 1/02* | (2006.01) | |
| *H05K 3/28* | (2006.01) | |

(52) U.S. Cl.
CPC .............. *G03F 7/029* (2013.01); *G03F 7/038* (2013.01); *G03F 7/039* (2013.01); *H05K 1/0218* (2013.01); *H05K 1/0277* (2013.01); *H05K 1/0346* (2013.01); *H05K 1/0393* (2013.01); *H05K 3/287* (2013.01); *H05K 2201/0154* (2013.01); *H05K 2201/0715* (2013.01); *H05K 2201/0776* (2013.01); *H05K 2201/10128* (2013.01)

(58) Field of Classification Search
CPC .... H05K 1/0313; H05K 1/032; H05K 1/0326; H05K 1/0333; H05K 1/034; H05K 1/0346; H05K 1/0353; H05K 1/036; H05K 1/0366; H05K 1/0373
See application file for complete search history.

(56) References Cited

U.S. PATENT DOCUMENTS

| | | |
|---|---|---|
| 2011/0021679 A1 | 1/2011 | Takahashi et al. |
| 2018/0094095 A1 | 4/2018 | Takahashi et al. |

FOREIGN PATENT DOCUMENTS

| | | |
|---|---|---|
| JP | H11-44954 A | 2/1999 |
| JP | H11-80294 A | 3/1999 |
| JP | H11-95428 A | 4/1999 |
| JP | 2005-232438 A | 9/2005 |
| JP | 2006-96962 A | 4/2006 |
| JP | 2009-235278 A | 10/2009 |
| JP | 5352175 B2 | 8/2013 |
| JP | 5380034 B2 | 1/2014 |
| JP | 5586729 B2 | 8/2014 |
| JP | 2015-92229 A | 5/2015 |
| JP | 2016-149388 A | 8/2016 |
| WO | 2012/029468 A1 | 3/2012 |
| WO | 2016/163285 A1 | 10/2016 |

OTHER PUBLICATIONS

International Search Report for related international application PCT/JP2018/004100 dated Apr. 24, 2018, citing the above references.
International Search Report for corresponding international application PCT/JP2017/007954 dated May 30, 2017, citing the above references.
The Written Opinion for corresponding international application PCT/JP2017/007954 dated May 30, 2017.
The Written Opinion for corresponding international application PCT/JP2018/004100 dated Apr. 4, 2018.
The Written Opinion for corresponding international application PCT/JP2018/004100 dated Apr. 24, 2018.

*Primary Examiner* — Jeremy C Norris
(74) *Attorney, Agent, or Firm* — Hauptman Ham, LLP

(57) ABSTRACT

The present invention provides a photosensitive resin composition with which a dry resist film can be obtained, the dry resist film exhibiting excellent storage stability and migration resistance in thickness direction thereof. This photosensitive resin composition comprises: a photosensitive prepolymer having a carboxyl group and an ethylenically unsaturated group; a photopolymerization initiator; and a thermosetting agent. The thermosetting agent is a polycarbodiimide compound represented by formula (1), in which a carbodiimide group is protected by an amino group that dissociates at temperatures of 80° C. or greater. The polycarbodiimide compound has a weight average molecular weight of 300-3000, and a carbodiimide equivalent weight of 150-600. In formula (1), $R^1$, $R^2$, $X^1$, $X^2$, and n are as defined in the description.

9 Claims, No Drawings

PHOTOSENSITIVE RESIN COMPOSITION, SOLDER RESIST FILM USING SAID PHOTOSENSITIVE RESIN COMPOSITION, FLEXIBLE PRINTED CIRCUIT AND IMAGE DISPLAY DEVICE

CROSS REFERENCE TO RELATED APPLICATION

This application claims the priority of Japanese Patent Application No. 2017-020628, filed on Feb. 7, 2017, in the Japanese Patent Office. Further, this application is the National Phase Application of International Application No. PCT/JP2017/007954, filed on Feb. 28, 2017, which designates the United States and was published in Japan. Both of the priority documents are hereby incorporated by reference in their entireties.

TECHNICAL FIELD

The present invention relates to a photosensitive resin composition, and particularly to a photosensitive resin composition used for a dry film resist used in a flexible printed circuit, a solder resist film using the photosensitive resin composition, a flexible printed circuit and an image display device including the flexible printed circuit.

BACKGROUND ART

Flexible printed circuits (FPC) have features such as flexibility and bending properties, and are widely used to incorporate circuits into complex mechanisms in various electronic devices such as mobile phones, video cameras, and laptops, which are rapidly becoming smaller, lighter and thinner.

The FPC is formed of a copper clad laminate (CCL) having a circuit formed by etching process and a cover coat material. The cover coat material is generally selected from a cover lay (CL) film, a photosensitive ink, a photosensitive film (photosensitive cover lay film) or the like. Among these, in a case of being used as a surface protection material for the FPC, a cover lay film obtained by applying an adhesive to a molded body (support) such as a polyimide film is often used from the viewpoint of ease of handling, durability, and insulation reliability in the thickness direction. The following mainly describes the FPC, but it can also be used for semiconductor package applications (semiconductor PKG applications). In addition to the copper clad laminate having a circuit formed by etching process as described above, a substrate on which a circuit is formed by printing using a paste-like nano-ink containing conductive fine particles such as silver particles and copper particles can also be used as a substrate for the FPC. The following mainly describes the CCL, but a substrate on which a circuit is formed by printing using a paste-like nano-ink containing conductive fine particles such as silver particles and copper particles is also included.

In a case of using a cover lay film including a polyimide layer for the FPC, it is a common method to provide an opening portion in the cover lay film at a part corresponding to a terminal portion of the circuit of the CCL, to position the opening portion and the corresponding terminal portion, and then to thermally compress the two with a heat press. However, in the above method, the size of the opening portion provided is limited, it is difficult to make a small hole of 1 mm or less in the micron unit, and the alignment during attaching is often performed manually, thus causing a poor position accuracy and also a poor workability of the laminating.

Thus, in recent years, a solder resist has come to be used as a surface protection material for the FPC, and particularly, a solder resist having a photosensitive function is preferably used when fine processing is required.

In the FPC having a solder resist layer, when the solder resist layer becomes thinner due to the miniaturization and thinning of the electronic devices, the CCL circuit is susceptible to electromagnetic waves. Therefore, an electromagnetic wave shield may be provided. However, on the other hand, when a shield layer made of a conductive material such as an electromagnetic wave shield is provided, upon applying a voltage, ions (metal ions) are eluted from a metal forming the CCL circuit and the migration phenomenon of moving in the solder resist layer, which is an insulator, is likely to occur in the thickness direction (hereinafter, also referred to as "Z axis direction") of the FPC. The metal ions eluted in the solder resist layer come in contact with each other to cause a short circuit, leading to system failure or the like.

Since polyimide is excellent in insulation as described above, the migration phenomenon in the thickness direction hardly occurs in the case of using the cover lay film including a polyimide layer, but the migration phenomenon in the thickness direction is likely to occur in the case of using the solder resist.

As a technique of improving the insulation properties of the solder resist layer in the thickness direction, for example, Patent Literature 1 proposes a photosensitive resin composition containing:
(A) a carboxyl group-containing photosensitive resin obtained by adding
d) a polybasic acid anhydride to a reaction product of a) an epoxy resin having two or more epoxy groups in one molecule, b) at least one type of fatty acid having 10 or more carbon atoms per carboxyl group and c) an ethylenically unsaturated group-containing carboxylic acid; (B) a photopolymerization initiator; (C) a (meth)acrylate monomer having a hydrophobic skeleton; (D) an epoxy compound; and (E) an inorganic cation exchanger. According to the photosensitive resin composition described in Patent Literature 1, it is supposed that an insulating film excellent in insulation reliability in the thickness direction is obtained.

CITATION LIST

Patent Literature

Patent Literature 1: JP-A-2015-92229

SUMMARY OF INVENTION

Technical Problem

The migration phenomenon is considered to be mainly occur in a direction horizontal to the plane of the FPC (hereinafter also referred to as "XY plane direction"), but as described above, when the thickness of the insulating layer (solder resist layer) in the Z axis direction becomes thinner, it is necessary to consider the migration phenomenon in the Z axis direction more than that in the XY plane direction. In other words, the migration phenomenon is more likely to occur in the Z axis direction than in the XY plane direction. Although the reason is not clear, according to the confirmation test of the inventors of the present invention, when a migration resistance test is performed by applying 50 V to, using a known resin composition (for example, a resin composition described in JP-A-2007-017644), a test piece having a line width of 15 μm and a interline width of 15 μm (hereinafter, also expressed as "L/S=15/15 μm") in the XY plane direction, and a test piece having an interlayer thickness of 15 μm in the Z-axis direction under an environment of 85° C. and 85% RH for 1000 hours (a method of preparing a sample is described later), the test piece having a line spacing of 15 μm in the XY plane direction maintains insulation even after 1000 hours, while the test piece having an interlayer thickness of 15 μm in the Z axis direction is shorted before reaching 100 hours, although the interline distance and the interlayer distance are the same.

It is considered that the migration phenomenon can be suppressed if the thickness of the solder resist layer is sufficient, but in the field of electronic devices where miniaturization and thinning are desired, studies are being made to make the solder resist layer thinner, and it is highly difficult to improve the insulation properties in the Z axis direction in which the migration phenomenon is likely to occur as in the above confirmation test.

According to Patent Literature 1, the insulation reliability in the thickness direction at 20 μm has been confirmed, but in the current situation where further miniaturization and thinning are required, it is sought to obtain migration resistance even when the solder resist layer is formed with a small thickness (for example, the thickness is less than 20 μm). In order to improve the migration resistance in the Z axis direction, it is also considered to increase the heat resistance of the solder resist, that is, to harden the resin. However, in the case of hardening the resin, there is a problem that the solder resist layer becomes brittle. In addition, warping is likely to occur during the curing, and curling is increased in a case where the substrate is formed and processed. Therefore, it is also required to have flexibility while providing the migration resistance.

In addition, in a case where a dry resist film is formed using a solder resist, it is desired that long-term storage (specifically, storage for 2 weeks or longer) in a film state can be achieved.

Accordingly, an object of the present invention is to provide a photosensitive resin composition used for forming a solder resist layer and capable of obtaining a dry resist film excellent in migration resistance in the thickness direction (Z axis direction) and storage stability, a solder resist film using the photosensitive resin composition, a flexible printed circuit and an image display device including the flexible printed circuit.

Solution to Problem

In order to solve the above problems, the inventors of the present invention have conducted intensive studies, and as a result, it is found that the above problems can be solved by forming a solder resist film with a photosensitive resin composition containing a photosensitive prepolymer, a photopolymerization initiator and a thermosetting agent and using a polycarbodiimide compound having specific physical properties as the thermosetting agent. Thus, the present invention has been completed.

That is, the present invention relates to the following <1> to <9>.

<1> A photosensitive resin composition, containing: a photosensitive prepolymer having a carboxyl group and an ethylenically unsaturated group; a photopolymerization initiator; and a thermosetting agent, wherein the thermosetting agent is a polycarbodiimide compound represented by the following Formula (1), in which carbodiimide group is protected by an amino group dissociating at a temperature of 80° C. or higher, and the polycarbodiimide compound has a weight average molecular weight of 300 to 3,000 and a carbodiimide equivalent of 150 to 600.

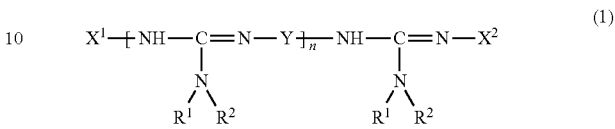

In Formula (1), $R^1$ and $R^2$ each independently represents a hydrogen atom, a linear or branched alkyl group having 1 to 6 carbon atoms, or a cycloalkyl group having 3 to 6 carbon atoms, $R^1$ and $R^2$ may be same as or different from each other, but both of them are not hydrogen atoms at the same time;

$X^1$ and $X^2$ each represents $-R^3-NH-COOR^4$, $R^3$ being a divalent organic group having at least one aromatic group and $R^4$ being a residue obtained by removing a hydroxy group from an organic group having one hydroxy group, and $X^1$ and $X^2$ being same as or different from each other; and Y represents $-R^5-NHCOO-R^6-OCOHN-R^5-$, each $R^5$ being independently a divalent organic group having at least one aromatic group and $R^6$ being a divalent organic group. $R^6$ is not an ether bond. n represents an integer of 1 to 5.

<2> The photosensitive resin composition according to <1>, wherein the carbodiimide of the polycarbodiimide compound has 2 to 5 functional groups.

<3> The photosensitive resin composition according to <1> or <2>, wherein the carbodiimide equivalent of the polycarbodiimide compound is 0.9 to 1.3 equivalents with respect to the carboxyl group of the photosensitive prepolymer.

<4> The photosensitive resin composition according to any one of <1> to <3>, used for a solder resist film.

<5> A solder resist film formed using the photosensitive resin composition according to any one of <1> to <4>.

<6> A flexible printed circuit including:
an insulating layer;
a wiring pattern made of a conductive material and provided on the insulating layer; and
a solder resist layer provided on the wiring pattern,
wherein the solder resist layer is formed using the photosensitive resin composition according to any one of <1> to <4>.

<7> The flexible printed circuit according to <6>, further including a shield layer on the solder resist layer, the shield layer containing a conductive material,
wherein the flexible printed circuit keeps a resistance value of $1.0 \times 10^7 \Omega$ or more for 500 hours or longer while a voltage of 50 V is applied under an atmosphere of a temperature of 85° C. and a relative humidity of 85% RH when the solder resist layer is cured such that an interlayer distance between the wiring pattern and the shield layer after curing the solder resist layer be 10 μm.

<8> A flexible printed circuit, including:
a substrate including a wiring pattern;
a solder resist layer covering the wiring pattern; and
a shield layer provided on the solder resist layer,
wherein the solder resist layer contains an acylurea, the shield layer is made of a conductive material, and
wherein an electrical insulation property of the flexible printed circuit satisfies a condition that a resistance value keeps $1.0 \times 10^7 \Omega$ or more for 500 hours or longer while a voltage of 50 V is applied under an atmosphere of a temperature of 85° C. and a relative humidity of 85% RH, when an interlayer distance between the wiring pattern and the shield layer after hot pressing is less than 20 μm.

<9> An image display device, including the flexible printed circuit according to any one of <6> to <8>.

Advantageous Effects of Invention

According to the photosensitive resin composition of the present invention, it is possible to form a solder resist film (cured film) having sufficient migration resistance in the Z axis direction even for a thin film (for example, a film having a thickness of 20 μm or less) on a predetermined metal circuit layer.

In addition, according to the photosensitive resin composition of the present invention, since the carbodiimide group in the polycarbodiimide compound is protected by the amino group, it does not react with the photosensitive prepolymer in the composition. Accordingly, even after heat processing at a temperature of lower than 80° C. to form a film, the reaction of carbodiimide can be suppressed, and the film can be stored at normal temperature for 2 weeks or longer. That is, the film can be developed even after a lapse of time after film formation.

Therefore, the flexible printed circuit including the solder resist layer formed using the photosensitive resin composition of the present invention can be suitably used as an electronic material component to be used in an electronic device to which miniaturization and thinning are required.

DESCRIPTION OF EMBODIMENTS

Although the embodiments of the present invention are described in detail, the present invention is not limited to the following embodiments, and can be implemented by various modifications within the scope of the present invention.

In the present invention, (meth)acrylic acid means acrylic acid or methacrylic acid, and the same applies to (meth) acrylate.

In addition, all percentages and parts expressed by mass are the same as percentages or parts expressed by weight.

A photosensitive resin composition of the present invention contains: a photosensitive prepolymer having a carboxyl group and an ethylenically unsaturated group; a photopolymerization initiator; and a thermosetting agent, wherein the thermosetting agent is a polycarbodiimide compound represented by the following Formula (1), in which carbodiimide group is protected by an amino group dissociating at a temperature of 80° C. or higher, and the polycarbodiimide compound has a weight average molecular weight of 300 to 3,000 and a carbodiimide equivalent of 150 to 600.

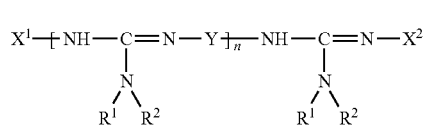

(1)

In Formula (1), $R^1$ and $R^2$ each independently represents a hydrogen atom, a linear or branched alkyl group having 1 to 6 carbon atoms, or a cycloalkyl group having 3 to 6 carbon atoms, $R^1$ and $R^2$ may be same as or different from each other, but both of them are not hydrogen atoms at the same time;

$X^1$ and $X^2$ each represents —$R^3$—NH—COOR$^4$, $R^3$ being a divalent organic group having at least one aromatic group and $R^4$ being a residue obtained by removing a hydroxy group from an organic group having one hydroxy group, and $X^1$ and $X^2$ being same as or different from each other;

Y represents —$R^5$—NHCOO—$R^6$—OCOHN—$R^5$—, each $R^5$ being independently a divalent organic group having at least one aromatic group and $R^6$ being a divalent organic group. $R^6$ is not an ether bond. n represents an integer of 1 to 5.

Hereinafter, each component is to be described in detail.
(Photosensitive Prepolymer)

As the photosensitive prepolymer in the present embodiment, one having an ethylenically unsaturated end group derived from an acrylic monomer is preferably used. The acrylic monomer used here is an acrylic acid or methacrylic acid, or derivatives thereof such as alkyl esters and hydroxyalkyl esters thereof.

Examples of the photosensitive prepolymer include a polyester acrylate, an epoxy acrylate, a urethane acrylate, an acrylated acrylate, a polybutadiene acrylate, a silicone acrylate, and a melamine acrylate. Among these, an epoxy acrylate and a urethane acrylate are preferred from the viewpoint of being excellent in balance of flexibility, heat resistance and adhesiveness.

The photosensitive prepolymer of the present embodiment is not particularly limited as long as the above conditions are met, and one having both a carboxyl group and at least two ethylenically unsaturated groups in one molecule is used. Specifically, particularly preferable examples include an epoxy (meth)acrylate compound (EA) having a carboxyl group, or a urethane (meth)acrylate compound (UA) having a carboxyl group.

<Epoxy (Meth)Acrylate Compound (EA) Having Carboxyl Group>

The epoxy (meth)acrylate compound having a carboxyl group in the present embodiment is not particularly limited, and an epoxy (meth)acrylate compound obtained by reacting a reaction product of an epoxy compound and an unsaturated group-containing monocarboxylic acid with an acid anhydride is suitable.

The epoxy compound is not particularly limited and examples thereof include epoxy compounds such as a bisphenol A-type epoxy compound, a bisphenol F-type epoxy compound, a bisphenol S-type epoxy compound, a phenol novolac-type epoxy compound, a biphenyl-type epoxy compound, a cresol novolac-type epoxy compound, or an aliphatic epoxy compound. The epoxy compound may be used alone, or may be used in combination of two or more thereof. Among these, it is preferable to use a bisphenol F-type epoxy compound from the viewpoint of flexibility, and it is preferable to use a biphenyl-type epoxy compound from the viewpoint of insulation.

Examples of the unsaturated group-containing monocarboxylic acid include an acrylic acid, a dimer of an acrylic acid, a methacrylic acid, a β-furfuryl acrylic acid, a β-styryl acrylic acid, a cinnamic acid, a crotonic acid, and an α-cyanocinnamic acid. In addition, examples also include a reaction product of a hydroxy group-containing acrylate with a saturated or unsaturated dibasic acid anhydride, and a reaction product of an unsaturated group-containing monoglycidyl ether with a saturated or unsaturated dibasic acid anhydride. The unsaturated group-containing monocarboxylic acid may be used alone, or may be used in combination of two or more thereof.

Examples of the acid anhydride include: dibasic acid anhydrides such as maleic anhydride, succinic anhydride, itaconic anhydride, phthalic anhydride, tetrahydrophthalic anhydride, hexahydrophthalic anhydride, methyl hexahydrophthalic anhydride, endomethylene tetrahydrophthalic anhydride, methylendomethylenetetrahydrophthalic anhydride, chlorendic anhydride, and methyltetrahydrophthalic anhydride; aromatic polyvalent carboxylic anhydrides such as trimellitic anhydride, pyromellitic anhydride, and benzophenone tetracarboxylic acid dianhydride; and polyvalent carboxylic acid anhydride derivatives such as 5-(2,5-dioxotetrahydrofuryl)-3-methyl-3-cyclohexene-1,2-dicarboxylic anhydride and endobicyclo-[2,2,1]-hept-5-ene-2,3-dicarboxylic anhydride. The acid anhydride may be used alone, or may be used in combination of two or more thereof.

The molecular weight of the obtained epoxy (meth)acrylate compound having a carboxyl group is not particularly limited, and the weight average molecular weight is preferably 5,000 to 15,000, and more preferably 8,000 to 12,000. Here, the weight average molecular weight is a value measured using gel permeation chromatography in terms of polystyrene.

In addition, the acid value (solid content acid value) of the epoxy (meth)acrylate compound is preferably in the range of 30 mg KOH/g to 150 mg KOH/g, and more preferably in the range of 40 mg KOH/g to 100 mg KOH/g from the viewpoint of balance between developability and flexibility after curing. The solid content acid value is a value measured according to JIS K0070.

The epoxy (meth)acrylate compound having a carboxyl group may independently constitute a photosensitive prepolymer, or may be used in combination with a urethane (meth)acrylate compound having a carboxyl group to be described later. In this case, the epoxy (meth)acrylate compound having a carboxyl group is preferably used in an amount of 100 parts by mass or less with respect to 100 parts of the urethane (meth)acrylate compound having a carboxyl group.

<Urethane (Meth)Acrylate Compound (UA) Having Carboxyl Group>

The urethane (meth)acrylate compound having a carboxyl group in the present embodiment is a compound which contains a unit derived from a (meth)acrylate having a hydroxy group, a unit derived from a polyol, and a unit derived from polyisocyanate as structural units. Specifically, it includes a unit derived from a (meth)acrylate having hydroxy groups at both ends, between which a repeating unit including a unit derived from a polyol and a unit derived from a polyisocyanate, the units being linked by a urethane bond is present. A carboxyl group is present in the repeating unit.

That is, the urethane (meth)acrylate compound having a carboxyl group is represented by the following formula.

In the formula, n is an integer of 1 to 200, $OR^{11}O$ is a dehydrogenation residue of a polyol, and $R^{12}$ is a deisocyanate residue of a polyisocyanate.

The urethane (meth)acrylate compound having a carboxyl group can be produced by reacting at least a (meth)acrylate having a hydroxy group, a polyol and a polyisocyanate, but here, it is necessary to use a compound having a carboxyl group for at least one of the polyol and the polyisocyanate. Preferably, a polyol having a carboxyl group is used. Thus, the urethane (meth)acrylate compound in which a carboxyl group is present in $R^{11}$ or $R^{12}$ can be produced by using the compound having a carboxyl group as a polyol and/or a polyisocyanate. In the above formula, n is preferably about 1 to 200, and more preferably 2 to 30. When n is within the above range, a cured film made of the photosensitive resin composition is more excellent in flexibility.

In addition, in a case where two or more of at least one of polyol and polyisocyanate are used, the repeating unit represents a plurality of types, but the regularity of the plurality of units can be appropriately selected depending on the purpose, such as perfect randomness, block, or localization.

Examples of the (meth)acrylate having a hydroxy group used in the present embodiment include ethanediol monoacrylate, propanediol monoacrylate, 1,3-propanediol monoacrylate, 1,4-butanediol monoacrylate, 1,6-hexanediol monoacrylate, 1,9-nonanediol monoacrylate, diethylene glycol monoacrylate, triethylene glycol monoacrylate, dipropylene glycol monoacrylate, 2,3-dihydroxypropyl acrylate, 3-(4-benzoyl-3-hydroxyphenoxy)-2-hydroxypropyl methacrylate, 2,3-dihydroxypropyl 2-methylpropenoic acid, 2-hydroxyethyl (meth)acrylate, hydroxypropyl (meth)acrylate, hydroxybutyl (meth)acrylate, caprolactone or alkylene oxide adducts of the above (meth)acrylates, glycerin mono(meth)acrylate, glycerin di(meth)acrylate, a glycidyl methacrylate-acrylic acid adduct, trimethylolpropane mono(meth)acrylate, trimethylol di(meth)acrylate, pentaerythritol tri(meth)acrylate, dipentaerythritol penta(meth)acrylate, ditrimethylolpropane tri(meth)acrylate, and trimethylolpropane-alkylene oxide adduct-di(meth)acrylate.

The (meth)acrylate having a hydroxy group may be used alone, or may be used in combination of two or more thereof.

A polymer polyol and/or a dihydroxy compound can be used as the polyol used in the present embodiment. Examples of the polymer polyol include: polyether-based diols such as polyethylene glycol, polypropylene glycol and polytetramethylene glycol; polyester-based polyols obtained from esters of polyhydric alcohols and polybasic acids; polycarbonate-based diols containing a unit derived from hexamethylene carbonate, and pentamethylene carbonate as a structural unit; and polylactone-based diols such as polycaprolactone diol and polybutyrolactone diol.

In addition, in a case of using a polymer polyol having a carboxyl group, for example, it is possible to use a compound synthesized such that trivalent or higher polybasic acids such as (anhydride) trimellitic acid are coexist and a carboxyl group remains during the above polymer polyol synthesis.

The polymer polyol may be used alone, or may be used in combination of two or more thereof. In addition, use of those having a weight average molecular weight of 200 to 2,000 as these polymer polyols is preferred since a cured film made of the photosensitive resin composition is more excellent in flexibility. Further, among these polymer polyols, use of a polycarbonate diol is preferred since a cured film made of the photosensitive resin composition is high in heat resistance and excellent in pressure cooker resistance. Further, it is more preferable that the structural unit of the polymer polyol is not only a single structural unit but also a plurality of structural units, since a cured film made of the photosensitive resin composition is further excellent in flexibility. Examples of such a polymer polyol including a plurality of structural units include polyether-based diols containing units derived from ethylene glycol and propylene glycol as structural units and polycarbonate diols containing units derived from hexamethylene carbonate and pentamethylene carbonate as structural units.

As the dihydroxy compound, a branched or linear compound having two alcoholic hydroxy groups can be used, and particularly a dihydroxy aliphatic carboxylic acid having a carboxyl group is preferably used. Examples of such a dihydroxy compound include dimethylol propionic acid and dimethylol butanoic acid. By using a dihydroxy aliphatic carboxylic acid having a carboxyl group, a carboxyl group can be easily present in the urethane (meth)acrylate compound.

The dihydroxy compound may be used alone, or may be used in combination of two or more thereof, and may be used in combination with the polymer polyol.

In a case of using the dihydroxy compound in combination with a polymer polyol having a carboxyl group, or in a case of using one having a carboxyl group as a polyisocyanate to be described later, a dihydroxy compound having no carboxyl group such as ethylene glycol, diethylene glycol, propylene glycol, 1,4-butanediol, 1,3-butanediol, 1,5-pentanediol, neopentyl glycol, 3-methyl-1,5-pentanediol, 1,6-hexanediol, 1,4-cyclohexanedimethanol, and hydroquinone may be used.

Specific examples of the polyisocyanate used in the present embodiment include diisocyanates such as 2,4-toluene diisocyanate, 2,6-toluene diisocyanate, isophorone diisocyanate, hexamethylene diisocyanate, diphenyl methylene diisocyanate, (o, m or p)-xylene diisocyanate, methylene bis(cyclohexyl isocyanate), trimethylhexamethylene diisocyanate, cyclohexane-1,3-dimethylene diisocyanate, cyclohexane-1,4-dimethylene diisocyanate and 1,5-naphthalene diisocyanate. The polyisocyanate may be used alone, or may be used in combination of two or more thereof. In addition, a polyisocyanate having a carboxyl group can also be used.

The molecular weight of the urethane (meth)acrylate compound having a carboxyl group used in the present embodiment is not particularly limited, and the weight average molecular weight (Mw) thereof is preferably, 1,000 to 30,000, and more preferably 8,000 to 20,000. When the weight average molecular weight of the urethane (meth)acrylate compound having a carboxyl group is 1,000 or more, a cured film made of the photosensitive resin composition is good in elongation and strength, and when the weight average molecular weight thereof is 30,000 or less, the cured film is good in flexibility.

In addition, the acid value of the urethane (meth)acrylate is preferably 30 mg KOH/g to 80 mg KOH/g, and more preferably 40 mg KOH/g to 60 mg KOH/g. When the acid value is 30 mg KOH/g or more, the alkali solubility of the photosensitive resin composition is good, and when the acid value is 80 mg KOH/g or less, the flexibility of the cured film is good.

The acid value of the urethane (meth)acrylate compound having a carboxyl group is preferably 30 mg KOH/g to 80 mg KOH/g, but even in this range, if the acid value is increased, the developability is improved, but the flexibility is likely to decrease; if the acid value is lowered, the flexibility is increased, but the developability is lowered and the developing residue is likely to generate. In this case, by using the urethane (meth)acrylate compound having at least two carboxyl group with different acid values in combination, a photosensitive resin composition having excellent flexibility and good developability can be easily obtained.

The urethane (meth)acrylate compound having a carboxyl group can be produced by: (1) a method of mixing and reacting a (meth)acrylate having a hydroxy group, a polyol, and a polyisocyanate; (2) a method of reacting a polyol and a polyisocyanate to produce a urethane isocyanate prepolymer having one or more isocyanate groups per molecule, and then reacting the urethane isocyanate prepolymer with a (meth)acrylate having a hydroxy group; and (3) a method of reacting a (meth)acrylate having a hydroxy group with a polyisocyanate to produce a urethane isocyanate prepolymer having one or more isocyanate groups per molecule, and then reacting the prepolymer with a polyol.

(Photopolymerization Initiator)

The photopolymerization initiator is not particularly limited and any known in the related art may be used. Specifically, representative examples include bis(2,4,6-trimethylbenzoyl)-phenylphosphine oxide, 2,4,6-trimethyl benzoyl diphenyl phosphine oxide, 1,2-octanedione, 1-[4-(phenylthio)phenyl-2-(O-benzoyloxime)], ethanone, 1-[9-ethyl-6-(2-methylbenzoyl)-9H-carbazol-3-yl]-,1-(O-acetyloxime), 2-benzyl-2-dimethylamino-1-(4-morpholinophenyl)-butanone-1,2-(dimethylamino)-2-[(4-methylphenyl)methyl]-1-[4-(4-morpholinyl)phenyl]-1-butanone, benzoin, benzoin methyl ether, benzoin ethyl ether, benzoin isopropyl ether, benzoin n-butyl ether, benzoin isobutyl ether, acetophenone, dimethylaminoacetophenone, 2,2-dimethoxy-2-phenylacetophenone, 2,2-diethoxy-2-phenylacetophenone, 2-hydroxy-2-methyl-1-phenylpropan-1-one, 1-hydroxycyclohexyl phenyl ketone, 2-methyl-1-[4-(methylthio)phenyl]-2-morpholino-propan-1-one, 4-(2-hydroxyethoxy)phenyl-2-(hydroxy-2-propyl) ketone, benzophenone, p-phenyl benzophenone, 4,4'-diethylaminobenzophenone, dichlorobenzophenone, 2-methyl anthraquinone, 2-ethyl anthraquinone, 2-tert-butyl anthraquinone, 2-aminoanthraquinone, 2-methylthioxanthone, 2-ethylthioxanthone, 2-chlorothioxanthone, 2,4-dimethylthioxanthone, 2,4 diethylthioxanthone, benzyl dimethyl ketal, acetophenone dimethyl ketal, and ethyl p-dimethylaminobenzate. The photopolymerization initiator may be used alone, or may be used in combination of two or more thereof.

Among these, from the viewpoint of thick film curability, it is preferable to use bis(2,4,6-trimethylbenzoyl)-phenylphosphine oxide, 2,4,6-trimethyl benzoyl diphenyl phosphine oxide, 2-benzyl-2-dimethylamino-1-(4-morpholinophenyl)-butanone-1,2-(dimethylamino)-2-[(4-methylphenyl)methyl]-1-[4-(4-morpholinyl)phenyl]-1-butanone, and thioxanthones.

The amount of the photopolymerization initiator to be used is preferably 2 parts by mass or more, more preferably 6 parts by mass or more, still more preferably 10 parts by mass or more, and is preferably 20 parts by mass or less, more preferably 16 parts by mass or less, still more preferably 14 parts by mass or less, with respect to 100 parts by mass of the photosensitive prepolymer. When the content of the photopolymerization initiator is 2 parts by mass or more with respect to 100 parts by mass of the photosensitive prepolymer, the photo-curing reaction of the photosensitive prepolymer easily proceeds. When the content thereof is 20 parts by mass or less, the curing reaction can be performed without causing the brittleness of the cured film and impairing the adhesion.

(Thermosetting Agent)

The thermosetting agent used in the present embodiment is a polycarbodiimide compound having a carbodiimide group which can react with the carboxyl group of the photosensitive prepolymer. The polycarbodiimide compound of the present embodiment is characterized in that the carbodiimide group in the structure thereof is protected by an amino group dissociating at a temperature of 80° C. or higher. "Protected" means that the carbodiimide group and the amino group are covalently bonded, but the bond is such that they are dissociated by heat.

Since the carbodiimide group (—N=C=N) has high reactivity with the carboxyl group and the reaction starts at the moment of mixing the carbodiimide group with the photosensitive prepolymer having the carboxyl group, the storage stability of the composition is poor, and it is not suitable for a dry resist film to be filmed at a temperature lower than 80° C., so that polycarbodiimide is not used in a photosensitive resin composition in the related art. That is, since polycarbodiimide cannot be present in the photosensitive resin composition as it is, a carbodiimide compound in which a carbodiimide group is protected by an amino group is used in the present invention.

Specifically, since the carbodiimide compound is heated and filmed at a temperature lower than 80° C. and thermal compression treatment such as heat lamination is performed also at a temperature lower than 80° C., the amino group is not dissociated from the carbodiimide group, and it is considered that accurate development can be performed at this time. Further, since the photosensitive resin composition of the present invention has appropriate fluidity during the thermal compression treatment, embedding of the pattern circuit in the FPC can be suitably performed. Thereafter, development treatment is performed to form an opening portion at a predetermined position. Then, when heating is performed at a temperature of 80° C. or higher at which the amino group dissociates, the amino group dissociates, the carbodiimide group reacts with the carboxyl group, and the photosensitive resin composition can be completely cured (C stage). Here, the reaction of the carbodiimide group with the carboxyl group forms a structure called acylurea. It is expected that, by forming such a structure, the amount of unreacted carboxyl groups in the resin composition after curing is reduced, as a result, contributing to the migration resistance.

The amino group is not particularly limited as long as it can be dissociated from the carbodiimide group at a temperature of 80° C. or higher, and any of a primary amino group to a tertiary amino group can be used. Among these, it is preferable to use a primary amino group and a secondary amino group having an active hydrogen from the viewpoint of improving the stability after binding to a carbodiimide group. The bonding force with a carbodiimide group is increased by using an amino group having an active hydrogen.

The polycarbodiimide compound of the present embodiment is a compound represented by the following Formula (1).

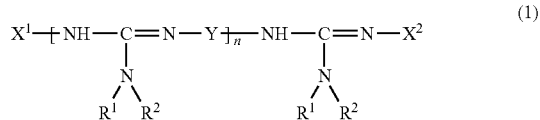

In Formula (1), $R^1$ and $R^2$ each independently represent a hydrogen atom, a linear or branched alkyl group having 1 to 6 carbon atoms, or a cycloalkyl group having 3 to 6 carbon atoms, $R^1$ and $R^2$ may be same as or different from each other, but both of them are not hydrogen atoms at the same time; $X^1$ and $X^2$ each represent —$R^3$—NH—COOR$^4$, $R^3$ being a divalent organic group having at least one aromatic group and $R^4$ being a residue obtained by removing a hydroxy group from an organic group having one hydroxy group, and $X^1$ and $X^2$ being same as or different from each other; and Y represents —$R^5$—NHCOO—$R^6$—OCOHN—$R^5$—, each $R^5$ being independently a divalent organic group having at least one aromatic group and $R^6$ being a divalent organic group. $R^6$ is not an ether bond. n represents an integer of 1 to 5.

In Formula (1), $R^1$ and $R^2$ each independently represent a hydrogen atom, a linear or branched alkyl group having 1 to 6 carbon atoms, or a cycloalkyl group having 3 to 6 carbon atoms. $R^1$ and $R^2$ linked to the same nitrogen atom may be same as or different from each other, but they are not both hydrogen atoms.

Examples of the linear or branched alkyl group having 1 to 6 carbon atoms include a methyl group, an ethyl group, a propyl group, an isopropyl group, an n-butyl group, a sec-butyl group, an isobutyl group, a tert-butyl group, a pentyl group, and a hexyl group. Examples of the cycloalkyl group having 3 to 6 carbon atoms include a cyclopropyl group, a cyclobutyl group, a cyclopentyl group, and a cyclohexyl group.

In a case where the amino group of the polycarbodiimide compound is a primary amine having two active hydrogens, the primary amine reacts with other carbodiimide groups to form a three-dimensional network structure and to gel. As a result, the compatibility with other components contained in the photosensitive resin composition may be reduced. Therefore, it is preferable to use a secondary amino group having one active hydrogen. Specifically, $R^1$ and $R^2$ each independently are more preferably a linear or branched alkyl group having 1 to 6 carbon atoms or a cycloalkyl group having 3 to 6 carbon atoms, and still more preferably an ethyl group, a methyl group, a propyl group, and an isopropyl group. Among these, it is particularly preferable that both $R^1$ and $R^2$ are propyl groups or isopropyl groups, and most preferably both are isopropyl groups.

In the present invention, the carbodiimide group of the polycarbodiimide is a structure protected by an amine. As described above, from the viewpoint of compatibility with other components, a secondary amine less likely to cause a crosslinking reaction is preferably used as the protective amine. Examples of the secondary amine include dimethylamine, N-ethylmethylamine, N-ethylpropylamine, N-methylbutylamine, N-methylpentylamine, N-hexylamine, N-methylcyclohexylamine, diethylamine, N-ethylpropylamine, N-ethylbutylamine, N-ethylpentylamine, N-ethylhexylamine, diisopropylamine, N-propylbutylamine, N-propylpentylamine, N-propylhexylamine, di-sec-butylamine, di-n-butylamine, and diisobutylamine.

As an amine used in the present embodiment, one having a boiling point of 160° C. or lower can be used suitably. When the carbodiimide group is protected by an amine having a boiling point of 160° C. or lower, the reaction with a carboxyl group at room temperature can be suppressed, and dissociation can occur in a temperature range of 80° C. to 200° C. The amine used is more preferably one having a boiling point of 50° C. to 140° C., and still more preferably one having a boiling point of 80° C. to 110° C. In a case of one having a boiling point of 80° C. to 110° C., the amine can be dissociated by heat treatment at 100° C. to 160° C.

In Formula (1), $X^1$ and $X^2$ each represent —$R^3$—NH—COOR$^4$. Here, $R^3$ is a divalent organic group having at least one aromatic group, $R^4$ is a residue obtained by removing a hydroxy group from an organic group having one hydroxy group, and $X^1$ and $X^2$ may be same as or different from each other.

Examples of the divalent organic group having at least one aromatic group represented by $R^3$ include a divalent residue of an aromatic diisocyanate having at least one aromatic group. Examples of the aromatic diisocyanate include 4,4'-diphenylmethane diisocyanate, 4,4'-diphenylether diisocyanate, p-phenylene diisocyanate, m-phenylene diisocyanate, 3,3'-dimethoxy-4,4'-biphenyl diisocyanate, o-tolidine diisocyanate, naphthalene diisocyanate, 2,4-tolylene diisocyanate, 2,6-tolylene diisocyanate, 3,3'-dimethoxy-4,4'-diphenylmethane diisocyanate, and 3,3'-dimethyl-4,4'-diphenylether diisocyanate. The aromatic diisocyanate may be used alone, or may be used in combination of two or more thereof.

Among these, divalent residues of 4,4'-diphenylmethane diisocyanate, 2,4-tolylene diisocyanate and 2,6-tolylene diisocyanate are preferred from the viewpoint of high versatility of industrial raw materials.

Examples of the residue obtained by removing a hydroxy group from an organic group having one hydroxy group represented by $R^4$ is not particularly limited as long as it is a residue of an organic group having no reactivity with the isocyanate group other than the hydroxy group, which does not inhibit the reaction of the hydroxy group of the organic group having one hydroxy group with the isocyanate group. Examples of the organic group having no reactivity with the isocyanate group other than the hydroxy group include hydroxyalkyl groups such as a hydroxymethyl group, a hydroxyethyl group, a hydroxypropyl group, and a hydroxybutyl group, a hydroxy ester group, a hydroxy ether group, and a hydroxy alkylene oxide group. Specifically, in a case where the organic group having one hydroxy group is a hydroxymethyl group, the residue obtained by removing a hydroxy group is a methyl group, and in a case of a hydroxyethyl group, the residue obtained by removing a hydroxy group is an ethyl group.

In the present embodiment, $R^4$ is preferably a residue obtained by removing a hydroxy group from a hydroxyalkyl group, and more preferably a methyl group or an ethyl group.

In Formula (1), Y represents —$R^5$—NHCOO—$R^6$—OCOHN—$R^5$—. Here, each $R^5$ is independently a divalent organic group having at least one aromatic group and $R^6$ is a divalent organic group. $R^6$ is not an ether bond.

Examples of the divalent organic group having at least one aromatic group represented by $R^5$ include a divalent residue of an aromatic diisocyanate having at least one aromatic group similar to $R^3$ described above, and specific examples and preferred examples thereof are also similar.

Examples of the divalent organic group represented by $R^6$ include an ester bond, a carbonate group, and a conjugated diene structure. In the present invention, $R^6$ cannot be an ether bond. Since the ether bond is hydrophilic, the desired effects of the present invention, particularly the migration resistance cannot be improved.

Specific examples of the divalent organic group represented by $R^6$ include a divalent residue of a diol compound. Examples of the diol compound include a low molecular weight diol or polyalkylene diol, a polycarbonate diol, a castor oil-based diol, and a polyester diol.

The low molecular weight diol or polyalkylene diol is a compound having two hydroxy groups in one molecule and examples thereof include ethylene glycol, 1,2-propanediol, 1,3-propanediol, 2-methyl-1,3-propanediol, 2,2-dimethyl-1,3-propanediol, 2,2-diethyl-1,3-propanediol, 2-butyl-2-ethyl-1,3-propanediol, 2-benzylene-2-propyl-1,3-propanediol, 1,2-butanediol, 1,3-butanediol, 1,4-butanediol, 1,5-pentanediol, 1,5-hexanediol, 1,6-hexanediol, 3-methyl-1,5-pentanediol, 2-ethyl-1,3-hexanediol, and 2,2,4-trimethyl-1,3-pentandiol.

Examples of the polycarbonate diol include a reaction product of a diol and a carbonate. Examples of the carbonate in producing a polycarbonate diol include: dialkyl carbonates such as dimethyl carbonate, diethyl carbonate, dipropyl carbonate, and dibutyl carbonate; diaryl carbonates such as diphenyl carbonate; and alkylene carbonates such as ethylene carbonate, trimethylene carbonate, 1,2-propylene carbonate, 1,2-butylene carbonate, 1,3-butylene carbonate, and 1,2-pentylene carbonate.

Examples of the castor oil-based diol include a castor oil fatty acid ester-based diol, and specific examples thereof include: castor oil; and castor oil fatty acid ester obtained by an ester exchange reaction of the above low molecular weight diol or diether polyol with castor oil or by an esterification reaction of the above low molecular weight diol or diether polyol with castor oil fatty acid.

Examples of the polyester diol include: a linear or branched polyester diol from a polycarboxylic acid [an aliphatic saturated or unsaturated polycarboxylic acid (adipic acid, azelaic acid, dodecanoic acid, maleic acid, fumaric acid, itaconic acid, and dimerized linoleic acid, or the like) and/or aromatic dicarboxylic acid (phthalic acid, isophthalic acid, or the like)] and a diol (the above low molecular weight diol); a polylactone diol [for example, a polyol (for example, polycaprolactone diol) obtained by addition polymerization of (substituted) caprolactone (ε-caprolactone, α-methyl-ε-caprolactone, ε-methyl-ε-caprolactone or the like) to one or more low molecular weight diols as an initiator in the presence of a catalyst (an organic metal compounds, a metal chelate compound, a fatty acid metal acylate, or the like)]; and a polycarbonate polyol obtained by addition polymerization of alkylene oxide (ethylene oxide, propylene oxide, or the like) to a polyester having a carboxyl group and/or an OH group on the end of the polyester.

Among these, from the viewpoint of improving migration resistance, the divalent organic group represented by $R^6$ is preferably a castor oil-based diol residue (residue obtained by removing two hydroxy groups from a castor oil-based structure), a low molecular weight diol residue, a polyalkylenediol residue, and a polycarbonate diol residue and more preferably a castor oil-based diol residue, a propanediol residue (—$(CH_2)_3$—), a butanediol residue (—$(CH_2)_4$—), and a polycarbonate diol residue (specifically, —O—C(=O)—O—$(CH_2)_n$—, n=3, 4).

In Formula (1), n is an integer of 1 to 5. In the embodiment of the present invention, since the number of functional groups of carbodiimide in the polycarbodiimide compound is preferably 2 or more from the viewpoint of obtaining a crosslinked product, the above effect can be exhibited when n is 1 or more.

In other words, the number of functional groups of the carbodiimide is 2 to 6, and from the viewpoint of hardly causing warping during the curing of the photosensitive resin composition, the number of functional groups of the carbodiimide is preferably 2 to 5.

In the present embodiment, as a preferred polycarbodiimide compound, in Formula (1), $R^1$ and $R^2$ are both isopropyl groups; $X^1$ and $X^2$ each represent —$R^3$—NH—COOR$^4$, $R^3$ being a divalent residue of 4,4'-diphenylmethane diisocyanate, 2,4-tolylene diisocyanate or 2,6-tolylene diisocyanate, $R^4$ being a residue obtained by removing a hydroxy group from a hydroxymethyl group or a hydroxyethyl group, $X^1$ and $X^2$ being same as or different from each other; Y represents —$R^5$—NHCOO—$R^6$—OCOHN—$R^5$—, each $R^5$ being independently a divalent residue of 4,4'-diphenylmethane diisocyanate, 2,4-tolylene diisocyanate or 2,6-tolylene diisocyanate, and $R^6$ being a castor oil-based diol residue, a propanediol residue, a butanediol residue, and a polycarbonate diol residue; and n is an integer of 1 to 5. The preferred polycarbodiimide compound is also referred to as "polycarbodiimide compound group A".

In the present invention, the weight average molecular weight of the polycarbodiimide compound is 300 to 3,000. It is preferable that the weight average molecular weight of the polycarbodiimide compound is 300 or more since warping is less likely to occur during the curing of the photosensitive resin composition; and it is preferable that the weight average molecular weight of the polycarbodiimide compound is 3,000 or less since the development time can be shortened. Further, the weight average molecular weight of the polycarbodiimide compound is preferably in the range of 300 to 1,200 from the viewpoint of migration resistance.

In the present invention, the weight average molecular weight is a value measured using gel permeation chromatography in terms of polystyrene.

In addition, in the present invention, the equivalent number of the carbodiimide in the polycarbodiimide compound is 150 to 600. When the equivalent number of the carbodiimide is 150 or more, warping of the cured product can be reduced. When the equivalent number of the carbodiimide is 600 or less, the desired crosslink density can be obtained to maintain migration resistance. In order to obtain further excellent migration resistance, the equivalent number of the carbodiimide is preferably 400 or less and more preferably 300 or less.

As a method of producing the polycarbodiimide compound in the present embodiment, for example, the polycarbodiimide compound can be produced by a method of reacting a carbodiimide monomer containing at least two isocyanate groups in one molecule with a polyol having a hydroxy group at the molecular end to obtain a polycarbodiimide, reacting the obtained polycarbodiimide with a hydroxy group-containing monomer to cap an end isocyanate group of the polycarbodiimide, and reacting the end-capped polycarbodiimide with an amine to protect the carbodiimide group with the amino group.

The polycarbodiimide is obtained by a known method, and can be prepared, for example, by the method disclosed in Japanese Patent Application Laid-Open No. 2007-138080.

With the above method, it is possible to obtain a polycarbodiimide compound in which the carbodiimide group is protected by an amino group.

The amount of the polycarbodiimide compound to be used is preferably such that the equivalent of the carbodiimide in the polycarbodiimide compound is 0.9 to 1.3 equivalents with respect to the carboxyl group in the photosensitive prepolymer. When the equivalent of the carbodiimide is 0.9 or more with respect to 1 equivalent of the carboxyl group, the migration resistance can be sufficiently improved and the storage stability of the dry film can be improved. In addition, when the equivalent of the carbodiimide is 1.3 or less with respect to 1 equivalent of the carboxyl group, the storage stability of the dry film can be maintained. The equivalent of the carbodiimide is more preferably 1.0 or more, and more preferably 1.2 or less.

(Photopolymerizable Compound)

In embodiment of the present invention, the photosensitive resin composition may contain a photopolymerizable compound.

Examples of the photopolymerizable compound as the component in the present embodiment are not particularly limited as long as photocrosslinking can be obtained, and a compound having an ethylenically unsaturated bond can be preferably used. Examples of the compound having an ethylenically unsaturated bond in the molecule include a (meth)acrylate compounds, a bisphenol A di(meth)acrylate compound, an epoxy acrylate compound, a modified epoxy acrylate compound, a fatty acid modified epoxy acrylate compound, an amine modified bisphenol A epoxy acrylate compound, a hydrogenated bisphenol A di(meth)acrylate compound, a di(meth)acrylate compound having a urethane bond in the molecule, a (meth)acrylate compound having a hydrophobic skeleton in the molecule, a polyalkylene glycol di(meth)acrylate compound having both a (poly)oxyethylene chain and a (poly)oxypropylene chain in the molecule, a trimethylolpropane di(meth)acrylate compound, and a polyester acrylate compound. The above compound may be used alone, or may be used in combination of two or more thereof.

In the present embodiment, examples of a photopolymerizable compound which is preferably used include "EBECRYL-3708" and "EBECRYL-1039" (trade names, manufactured by DAICEL-ALLNEX LTD.), and "R-684", "HX-220", and "HX-620" (trade names, manufactured by Nippon Kayaku Co., Ltd.) as commercially available products.

The amount of the photopolymerizable compound to be used is preferably 10 parts by mass or more, more preferably 20 parts by mass or more, still more preferably 30 parts by mass or more, and is preferably 60 parts by mass or less, more preferably 50 parts by mass or less, still more preferably 40 parts by mass or less, with respect to 100 parts by mass of the photosensitive prepolymer. With respect to 100 parts by mass of the photosensitive prepolymer, when the content of the photopolymerizable compound is 10 parts by mass or more, the resolution during the preparation of the FPC can be improved and thus detailed circuit patterns can be drawn; and when the content thereof is 60 parts by mass or less, the cured film has flame retardance and heat resistance, which is thus preferred.

(Colorant)

The photosensitive resin composition of the present invention may further contain a colorant. When the colorant is contained, it is possible to control the shape and resolution of the pattern circuit.

Examples of the colorant used in the present embodiment include an organic pigment and an inorganic pigment.

Examples of the organic pigment include organic pigments such as phthalocyanine-based one, quinacridone-based one, benzimidazolone-based one, dioxazine-based one, indanthrene-based one, perylene-based one, azo-based one, quinophthalone-based one, anthraquinone-based one, aniline-based one and cyanine-based one.

Examples of the inorganic pigment include carbon black, titanium black, ultramarine blue, Prussia blue, yellow lead, zinc yellow, red lead, iron oxide red, zinc flower, lead white, lithopone, and titanium dioxide.

The above pigment may be used alone, or may be used in combination of two or more thereof. Among these, it is preferable to use an organic pigment from the viewpoint of insulation.

For example, in a case when a black solder resist film is required, it is preferable to contain a black pigment as a colorant.

Examples of the black pigment include titanium black, carbon black, carbon nanotube, acetylene black, aniline black, perylene black, strontium titanate, chromium oxide and cerium oxide.

The colorant is preferably used as a dispersion liquid. This dispersion liquid can be prepared by adding and dispersing a composition obtained by previously mixing a colorant and a dispersant to an organic solvent (or a vehicle). The vehicle refers to a portion of a medium in which the pigment is dispersed when a paint is in a liquid state, and contains a portion (binder) which is liquid and bonds to the pigment to harden the coating, and a component (organic solvent) which dissolves and dilutes the above portion.

The colorant used in the present embodiment preferably has a number average particle diameter of 0.001 μm to 0.1 μm, and more preferably 0.01 μm to 0.08 μm from the viewpoint of dispersion stability. The "particle diameter" used here refers to a diameter of a circle having the same area as the electron micrograph image of the particle, and the "number average particle diameter" refers to the average value of 100 particle diameters among the above particle diameter obtained for a large number of particles.

The amount of the colorant to be used is preferably 0.2 part by mass to 3 parts by mass, and more preferably 0.5 part by mass to 2 parts by mass in solid content with respect to 100 parts by mass of the photosensitive prepolymer. In addition, the content of the black pigment during the preparation of the black solder resist film is preferably 1 part by mass to 10 parts by mass, and more preferably 3 parts by mass to 7 parts by mass in solid content with respect to 100 parts by mass of the photosensitive prepolymer. When the content of the colorant is too small, during pattern formation (or patterning), the problem that the desired shape cannot be drawn due to the scattering of the exposure light tends to occur. When the content thereof is too large, during the photo-curing, the bottom of the film cannot be exposed to light, uncured part is remained inside of the film, and erosion of the cured film may occur during etching, resulting in poor pattern formation. Thus, the above range is preferred.

(Other Components)

The photosensitive resin composition of the present invention may contain other components as long as the desired effects of the present invention are not impaired. Examples of other components include a flame retardant, a plasticizer, and a filler.

Examples of the flame retardant include: organic phosphinic acid-based flame retardants; metal oxides; phosphates; phosphazene compounds; salts of melamine and thermal condensates of melamine and polyphosphoric acid; and compounds of melamine and isocyanuric acid.

Examples of the plasticizer include p-toluenesulfonamide.

Examples of the filler include silica, alumina, talc, calcium carbonate, and barium sulfate.

Other components may be used alone, or may be used in combination of two or more thereof.

The amount of other components to be used is preferably 5 parts by mass to 60 parts by mass, and more preferably 20 parts by mass to 40 parts by mass with respect to 100 parts by mass of the photosensitive prepolymer.

(Preparation of Photosensitive Resin Composition)

The method for preparing the photosensitive resin composition of the present invention can include a known method in the related-art, and is not particularly limited. For example, photosensitive resin composition can be prepared by sequentially mixing a photosensitive prepolymer with a photopolymerization initiator, a thermosetting agent and other optional components.

The mixing step can be performed using mixers, such as a bead mill and a roll mill.

The photosensitive resin composition of the present invention may be liquid or film-like. A film-like photosensitive resin composition can be formed, for example, by applying the photosensitive resin composition of the present invention onto a film which has been subjected to a mold release treatment, and removing the solvent contained in the resin composition at a predetermined temperature. The application method can be appropriately selected according to the desired thickness such as a comma coater, a gravure coater, and a die coater.

(Photosensitive Film)

The photosensitive film of the present invention includes a support and a photosensitive resin composition layer formed on the support, and the photosensitive resin composition layer contains the above photosensitive resin composition. The photosensitive film may have a protective film layer on the surface opposite to the support of the photosensitive resin composition layer.

According to the photosensitive film of the present embodiment, it is excellent in flexibility and a solder resist film can be easily formed after the photosensitive film is cured.

Hereinafter, a method for preparing the photosensitive film will be described.

The photosensitive resin composition layer is preferably formed by dissolving the photosensitive resin composition of the present invention in a solvent such as methanol, ethanol, acetone, methyl ethyl ketone, methyl cellosolve, ethyl cellosolve, toluene, N,N-dimethylformamide, and propylene glycol monomethyl ether or a mixed solvent thereof to form a solution having a solid content of about 30 mass % to 70 mass %, and then applying the solution onto a support.

Examples of the support include a polymer film having heat resistance and solvent resistance such as polyesters such as polyethylene terephthalate, polypropylene, and polyethylene. It is preferable that the surface of the support onto which the resin composition is applied be subjected to a release treatment.

The thickness of the support can be appropriately selected based on the application and the thickness of the resin composition.

The thickness of the photosensitive resin composition layer varies depending on the application, and the thickness after drying and removing the solvent by heating and/or hot air spraying is preferably 5 μm to 100 μm, and more preferably 10 μm to 50 μm.

Examples of the protective film include a polyethylene film, a polypropylene film, and a polyethylene terephthalate.

The photosensitive film of the present invention can be stored as it is and has storage stability of about 2 weeks or longer at normal temperature (23° C.).

The photosensitive film of the present invention can be used to form a resist pattern. The resist pattern can be produced by a production method including, for example: a lamination step of laminating a photosensitive film on a circuit forming substrate; an exposure step of irradiating a predetermined portion of a photosensitive resin composition layer with an actinic ray to form a cured portion on the photosensitive resin composition layer; a development step of removing the photosensitive resin composition layer excluding the cured portion; and a thermal curing step of curing the photosensitive resin composition layer of the cured portion by heating.

In a case where the photosensitive film has a protective film, a step of removing the protective film from the photosensitive film is included.

The circuit forming substrate includes an insulating layer and a conductor layer (a layer made of a conductive material such as copper, a copper-based alloy, silver, a silver-based alloy, nickel, chromium, iron, an iron-based alloy such as stainless steel, and preferably made of copper or a copper-based alloy) formed on the insulating layer by etching or printing. In the lamination step, the photosensitive resin composition layer of the photosensitive film is laminated on the conductor layer side of the circuit forming substrate.

Examples of a method for laminating the photosensitive film in the lamination step include a method of performing lamination by heating the photosensitive resin composition layer and compressing the same to the circuit forming substrate. In case of performing lamination in this manner, it is preferable to perform lamination under reduced pressure in terms of adhesion and followability.

In the lamination step, the heating of the photosensitive resin composition layer is preferably performed at a temperature of 30° C. or higher and lower than 80° C., the compression pressure is preferably about 0.1 MPa to 2.0 MPa, and the ambient pressure is preferably 3 hPa or less. When the heating temperature is 80° C. or higher, the amino group of the polycarbodiimide compound in photosensitive resin composition dissociates from carboxyl group, so that the lamination step is performed at a temperature lower than the dissociation temperature.

In the exposure step, a predetermined portion of the photosensitive resin composition layer is irradiated with an actinic ray to form a cured portion. Examples of a method for forming the cured portion include a method of imagewise performing irradiation with an actinic ray through a negative or positive mask pattern called artwork. In addition, it is also possible to perform exposure by a direct drawing method having no mask pattern such as an LDI (Laser Direct Imaging) method or a DLP (Digital Light Processing) (registered trademark) exposure method. At this time, in a case where the support present on the photosensitive resin composition layer is transparent, the irradiation can be performed with an actinic ray as it is. In a case where the support is opaque, the photosensitive resin composition layer is irradiated with an actinic ray after the support is removed.

As the light source of the actinic ray, a known light source can be used, for example, a light source effectively emitting ultraviolet rays, such as a carbon arc lamp, a mercury vapor arc lamp, an ultra-high pressure mercury lamp, a high pressure mercury lamp, a xenon lamp, and a semiconductor laser. In addition, a light source effectively emitting visible light can also be used, for example, a flood light bulb for a photo, and a sun lamp.

Next, in a case where a support is present on the photosensitive resin composition layer, the support is removed, and in the development step, the photosensitive resin composition layer excluding the cured portion is removed by wet development, dry development or the like to perform development to form a resist pattern.

In the case of wet development, the development can be performed by known methods such as spraying, rocking immersion, brushing, and scraping, using developing solutions such as alkaline aqueous solution. The developing solution is preferably safe and stable and has good operability. For example, a dilute solution (1 mass % to 5 mass % aqueous solution) of sodium carbonate at 20° C. to 50° C. is used.

In a case where the resist pattern obtained by the above formation method is used as, for example, a solder resist film of a flexible printed circuit, a heating and curing step is performed after the development step. With the heating and curing step, the amino group of the polycarbodiimide compound in the photosensitive resin composition of the photosensitive resin composition layer dissociates, and a cured film can be formed.

The heating method can include heating with an oven. As the heating condition, the heating is preferably performed at a temperature of 80° C. or higher for 20 minutes to 120 minutes. Since the amino group of the polycarbodiimide compound dissociates at 80° C. or higher, by performing heating at 80° C. or higher, the amino group can be dissociated from the carbodiimide group and reacted with the carboxyl group of the photosensitive prepolymer, so as to cure the photosensitive resin composition. The upper limit of heating temperature is not particularly limited, and for example, it is preferable to perform heating at 200° C. or lower from the viewpoint of working efficiency.

(Flexible Printed Circuit)

With the above method, a flexible printed circuit (FPC) in which a wiring pattern made of a conductive material and a solder resist layer are successively formed on the insulating layer is obtained, and an acylurea structure is formed in the solder resist layer by the reaction of the carbodiimide group with the carboxyl group. In the present invention, the FPC may further include a shield layer containing a conductive material on the solder resist layer.

Examples of the shield layer include those having a three-layer structure of insulating layer/metal layer/conductive adhesive layer, and a commercially available shield film can be used.

Examples of the conductive material constituting the shield layer include a metal. Examples of the metal include gold, silver, copper, aluminum, nickel and an alloy thereof.

In order to enhance the adhesiveness between the shield layer and the solder resist layer, for example, in the case of a shield layer having a three-layer structure, the conductive adhesive layer is provided in contact with the solder resist layer.

In the present invention, it is preferable that, when a flexible printed circuit is prepared in which a solder resist layer is provided such that the interlayer distance between the wiring pattern and the shield layer is 10 μm in the film thickness after curing, and when the flexible printed circuit is subjected to continuous measurement for resistance value while a voltage of 50 V is applied under an atmosphere of a temperature of 85° C. and a relative humidity of 85% RH, a resistance value keeps $1.0 \times 10^7 \Omega$ or more for 500 hours or longer.

When the above environmental resistance test is performed, it can be said that the solder resist has practically excellent migration resistance if the electrical insulation properties of the flexible printed circuit has a resistance value of $1.0 \times 10^7 \Omega$ or more for 500 hours or longer, and preferably the resistance value continues for 1,000 hours or longer. Keeping the resistance value of $1.0 \times 10^7 \Omega$ or more for 500 hours or longer in the above environmental resistance test can be achieved by forming a solder resist layer with the photosensitive resin composition of the present invention.

(Image Display Device)

The image display device of the present invention includes the flexible printed circuit (FPC) of the present invention. The image display device of the present invention includes, for example, a liquid crystal display substrate including a liquid crystal display unit on the surface of a liquid crystal panel display, a printed substrate provided with a drive circuit for the liquid crystal display substrate, and a flexible printed circuit (FPC) for electrically connecting the liquid crystal display substrate and the printed substrate, and the flexible printed circuit of the present invention is used as the FPC.

The liquid crystal display substrate is formed by sealing a liquid crystal for forming a display region including a large number of pixel arrays between two insulating glass-based substrates, and one surface thereof forms a liquid crystal display portion. The printed substrate is a so-called control substrate on which a control IC for driving and controlling a touch sensor module is mounted.

The flexible printed circuit (FPC) of the present invention has one end adhered to the liquid crystal display substrate and the other end adhered to the printed substrate, and the liquid crystal display substrate and the printed substrate are electrically connected by the FPC of the present invention.

EXAMPLES

Hereinafter, the present invention is specifically described by way of Examples and Comparative Examples, but the present invention is not limited thereto.

Examples and Comparative Examples (i) Preparation of Photosensitive Resin Composition Respective components were blended at the blending ratio shown in Table 2 and mixed by a mixer to obtain photosensitive resin compositions used in Examples 1 to 10 and Comparative Examples 1 to 3. The polycarbodiimide in Table 2 uses those in Table 1, which correspond to the polycarbodiimide compound group A described above. In addition, the equivalent number of the polycarbodiimide in Table 2 represents the equivalent number of the carbodiimide group with respect to the carboxyl group contained in the photosensitive prepolymer.

(ii) Preparation of Dry Film

The photosensitive resin composition obtained in the above (i) was applied onto a 25 μm thick polyethylene terephthalate (PET) film such that the thickness after drying was 16 μm or 25 μm. The photosensitive resin composition was dried at 80° C. for 5 minutes, and then a polyethylene film was attached to the photosensitive resin composition on the applied side, so as to obtain a dry film of the photosensitive resin composition.

<Measurement of Migration Resistance>

(1) Preparation of Test Sample

A flexible copper clad laminate ("PNS H1012RAH" manufactured by Arisawa Manufacturing Co., Ltd.) was prepared in which a copper straight circuit pattern having a thickness of 12 μm, a line width of 50 μm, and a space width of 50 μm was provided on one side of a 25 μm thick polyimide substrate. The polyethylene film was peeled off from the 16 μm thick dry film prepared in the above (ii) and the dry film was attached to the flexible copper clad laminate by vacuum lamination. The vacuum lamination was performed at a hot plate temperature of 50° C. to 60° C., a press pressure of 0.5 MPa to 1.0 MPa, a press time of 10 seconds to 20 seconds, and a vacuum degree of 3 hPa or less. After vacuum lamination, irradiation was performed using ultraviolet rays of 200 mJ/cm$^2$ with an extra-high pressure mercury lamp. After irradiation, the PET film was peeled off, and development was performed using a 1 wt % aqueous solution of sodium carbonate at 30° C. for 60 seconds under a spray pressure of 0.18 MPa. After development, irradiation was performed using ultraviolet rays of 1,000 mJ/cm$^2$ with a high pressure mercury lamp. After irradiation, curing was performed at 150° C. for 90 minutes with a hot air circulating dryer. After curing, an electromagnetic wave shielding film ("SF-PC 8600/-C" manufactured by Tatsuta Electric Wire Cable Co., LTD) was attached onto the upper portion of the dry film by a hot press, so as to prepare a test sample. The hot press conditions were as follows: a hot plate temperature of 180° C., a press pressure of 2.94 MPa, and a press time of 60 minutes. The interlayer distance between the circuit pattern and the electromagnetic wave shielding film was 10 μm.

(2) Measurement Method and Determination Criteria

The electromagnetic wave shielding film side of the prepared test sample was connected to the negative electrode, and the copper side of the flexible copper clad laminate was connected to the positive electrode. Next, 50 V was applied to a constant temperature and humidity chamber set at 85° C. and 85% RH, and the resistance value was continuously measured using an ion migration tester ("AMI-025-S-5" manufactured by ESPEC CORP). A resistance value of less than $1.0 \times 10^7 \Omega$ was defined as insulation breakdown, and the time until the insulation breakdown was measured.

(Determination Criteria)

⊚: The resistance value is maintained at $1.0 \times 10^7 \Omega$ or more even after 1,000 hours of application.

○: The resistance value decreases to less than $1.0 \times 10^7 \Omega$ in 500 hours or longer and shorter than 1,000 hours.

Δ: The resistance value decreases to less than $1.0 \times 10^7 \Omega$ in 250 hours or longer and shorter than 500 hours.

x: The resistance value decreases to less than $1.0 \times 10^7 \Omega$ in shorter than 250 hours.

(Storage Stability Test)

(1) Preparation of Test Sample

The 25 μm thick dry film prepared in the above (ii) was stored at 23° C. in the dark. The polyethylene film was peeled off from the dry film after being stored for a predetermined period shown in the following evaluation criteria, and the dry film was attached onto a 35 μm thick rolled copper foil by vacuum lamination to prepare an attaching test sample. The vacuum lamination was performed at a hot plate temperature of 50° C. to 60° C., a press pressure of 0.5 MPa to 1.0 MPa, a press time of 10 seconds to 20 seconds, and a vacuum degree of 3 hPa or less.

(2) Measurement Method and Determination Criteria

Irradiation was performed using ultraviolet rays of 200 mJ/cm$^2$ with an ultra-high pressure mercury lamp through a photomask on which a predetermined pattern (φ100 μm) was formed. After irradiation, the PET film was peeled off, and the dry film was developed at 30° C. for 60 seconds to 120 seconds using a 1 wt % aqueous solution of sodium carbonate under a spray pressure of 0.18 MPa. The resolution was evaluated according to the following criteria.

(Evaluation Criteria)

⊚: A resolution of φ100 μm is obtained even after storage at 23° C. for 4 weeks or longer, and no development residue.

○: A resolution of φ100 μm is obtained after storage at 23° C. for 3 weeks or longer.

Δ: A resolution of φ100 μm is obtained after storage at 23° C. for 2 weeks or longer.

x: A resolution of φ100 μm cannot be obtained for storage at 23° C. for shorter than 2 weeks.

<Warping Confirmation Test>

(1) Preparation of Test Sample

The 25 μm thick dry film prepared in the above (ii) was used. The polyethylene film was peeled off from the dry film, and the dry film was attached onto a 35 μm thick rolled copy foil by vacuum lamination. The vacuum lamination was performed at a hot plate temperature of 50° C. to 60° C., a press pressure of 0.5 MPa to 1.0 MPa, a press time of 10 seconds to 20 seconds, and a vacuum degree of 3 hPa or less. After vacuum lamination, irradiation was performed using ultraviolet rays of 200 mJ/cm² with an extra-high pressure mercury lamp. After irradiation, the PET film was peeled off, and development was performed using a 1 wt % aqueous solution of sodium carbonate at 30° C. for 60 seconds under a spray pressure of 0.18 MPa. After development, irradiation was performed using ultraviolet rays of 1,000 mJ/cm² with a high pressure mercury lamp. After irradiation, curing was performed at 150° C. for 90 minutes with a hot air circulating dryer, so as to obtain a test sample.

(2) Measurement Method and Determination Criteria

The test sample was cut into 10 cm×10 cm, then the cut test sample was placed on a horizontal stage with a recess of the test sample facing upward, no external force was applied. The distance between the end of the test sample and the stage was measured with a scale. The evaluation criteria are as follows.

(Determination Criteria)
⊚: less than 5 mm
○: 5 mm or more and less than 1 cm
Δ: 1 cm or more and less than 3 cm
x: 3 cm or more <Heat Resistance Test>

(1) Preparation of Test Sample

The 25 μm thick dry film prepared in the above (ii) was used. The polyethylene film was peeled off from the dry film, and the dry film was attached onto a 35 μm thick rolled copper foil by vacuum lamination. The vacuum lamination was performed at a hot plate temperature of 50° C. to 60° C., a press pressure of 0.5 MPa to 1.0 MPa, a press time of 10 seconds to 20 seconds, and a vacuum degree of 3 hPa or less. After vacuum lamination, irradiation was performed using ultraviolet rays of 200 mJ/cm² with an extra-high pressure mercury lamp. After irradiation, the PET film was peeled off, and development was performed using a 1 wt % aqueous solution of sodium carbonate at 30° C. for 60 seconds under a spray pressure of 0.18 MPa. After development, irradiation was performed using ultraviolet rays of 1,000 mJ/cm² with a high pressure mercury lamp. After irradiation, curing was performed at 150° C. for 90 minutes with a hot air circulating dryer, so as to obtain a test sample.

The test sample was placed into a constant temperature and humidity chamber set at a temperature of 85° C. and a relative humidity of 85% RH. Solder was charged into solder baths, and solder liquids set at 240° C., 250° C. and 260° C. respectively were prepared. The test sample placed into the constant temperature and humidity chamber was taken out after 24 hours, and immediately after being taken out, the test sample was floated in the solder liquid set at 240° C. for 1 minute, floated in the solder liquid set at 250° C. for 1 minute, and floated in the solder liquid set at 260° C. for 1 minute in this order. Then the test sample was visually confirmed whether the dry film was swelling or peeling. The heat resistance was evaluated based on the following evaluation criteria by the temperature at which the swelling and peeling generated on the test sample.

(Determination Criteria)
⊚: No swelling or peeling of the test sample even when the temperature of the solder liquid is 260° C.
○: When the temperature of the solder liquid is 260° C., swelling and peeling generate on the test sample.
Δ: When the temperature of the solder liquid is 250° C., swelling and peeling generate on the test sample.
x: When the temperature of the solder liquid is 240° C., swelling and peeling generate on the test sample.

The results of the above tests are shown in Table 2.

TABLE 1

Types of polycarbodiimide

| | Weight average molecular weight | Equivalent (g/eq) | Number of functional groups | Type of $R^6$ in Formula (1) | Dissociation start temperature of amino group |
|---|---|---|---|---|---|
| A | 300 | 150 | 2 | Butanediol residue | 110° C. |
| B | 750 | 150 | 5 | Butanediol residue | 110° C. |
| C | 900 | 150 | 6 | Butanediol residue | 110° C. |
| D | 600 | 300 | 2 | Castor oil-based diol residue | 110° C. |
| E | 600 | 300 | 2 | Butanediol residue | 110° C. |
| F | 600 | 300 | 2 | Carbonate diol residue | 110° C. |
| G | 1,200 | 600 | 2 | Castor oil-based diol residue | 110° C. |
| H | 3,000 | 600 | 5 | Castor oil-based diol residue | 110° C. |
| I | 600 | 300 | 2 | Polyether diol residue | 110° C. |
| J | 1,400 | 700 | 2 | Castor oil-based diol residue | 110° C. |
| K | 3,600 | 600 | 6 | Castor oil-based diol residue | 110° C. |

TABLE 2

| | | | Example 1 | Example 2 | Example 3 | Example 4 | Example 5 | Example 6 | Example 7 |
|---|---|---|---|---|---|---|---|---|---|
| Composition | Photosensitive prepolymer (A) | | 100 | 100 | 100 | 100 | 100 | 100 | 100 |
| | Polycarbodiimide (upper part: equivalent number, lower part: part added) | A | 1.0 eq 26.8 | | | | | | |
| | | B | | 1.0 eq 26.8 | | | | | |
| | | C | | | 1.0 eq 26.8 | | | | |
| | | D | | | | 1.0 eq 53.6 | 0.9 eq 48.2 | 1.3 eq 69.6 | |
| | | E | | | | | | | 1.0 eq 53.6 |
| | | F | | | | | | | |
| | | G | | | | | | | |
| | | H | | | | | | | |
| | | I | | | | | | | |
| | | J | | | | | | | |
| | | K | | | | | | | |

TABLE 2-continued

| | | | | | | | | | |
|---|---|---|---|---|---|---|---|---|---|
| Evaluation | Photopolymerization initiator (B) | | 10 | 10 | 10 | 10 | 10 | 10 | 10 |
| | Modified epoxy acrylate (C) | | 30 | 30 | 30 | 30 | 30 | 30 | 30 |
| | Migration resistance | | ⊚ | ⊚ | ⊚ | ○ | ○ | ⊚ | ⊚ |
| | Storage stability | | ⊚ | ○ | ○ | ⊚ | ⊚ | ○ | ⊚ |
| | Bending | | ⊚ | ○ | Δ | ⊚ | ⊚ | ○ | ⊚ |
| | Heat resistance | | ⊚ | ⊚ | ⊚ | ⊚ | ○ | ⊚ | ○ |

| | | | Example 8 | Example 9 | Example 10 | Comparative Example 1 | Comparative Example 2 | Comparative Example 3 |
|---|---|---|---|---|---|---|---|---|
| Composition | Photosensitive prepolymer (A) | | 100 | 100 | 100 | 100 | 100 | 100 |
| | Polycarbodiimide | A | | | | | | |
| | (upper part: equivalent | B | | | | | | |
| | number, lower part: | C | | | | | | |
| | part added) | D | | | | | | |
| | | E | | | | | | |
| | | F | 1.0 eq 53.6 | | | | | |
| | | G | | 1.0 eq 107.1 | | | | |
| | | H | | | 1.0 eq 107.4 | | | |
| | | I | | | | 1.0 eq 53.6 | | |
| | | J | | | | | 1.0 eq 125.0 | |
| | | K | | | | | | 1.0 eq 107.1 |
| | Photopolymerization initiator (B) | | 10 | 10 | 10 | 10 | 10 | 10 |
| | Modified epoxy acrylate (C) | | 30 | 30 | 30 | 30 | 30 | 30 |
| Evaluation | Migration resistance | | ○ | ○ | ○ | X | Δ | ○ |
| | Storage stability | | ⊚ | ⊚ | ○ | ⊚ | ⊚ | Δ |
| | Bending | | ⊚ | ⊚ | ○ | ⊚ | ⊚ | Δ |
| | Heat resistance | | ○ | ○ | ○ | Δ | Δ | ○ |

Notes)
(A): Carboxylic acid modified bisphenol type epoxy acrylate: Mw = 12,000, acid value = 100 mg KOH/g
(B): 2,4,6-trimethyl benzoyl diphenyl phosphine oxide
(C): "EBECRYL-3708" (trade name) manufactured by DAICEL-ALLNEX LTD (Mw = 1,500, difunctional)

From the results of Table 2, in all of Examples 1 to 10, the resistance value of $1.0 \times 10^7 \Omega$ or more can continue for 500 hours or longer in the migration resistance test. From this result, it is seen that the insulation properties in the Z axis direction is excellent. In addition, it is seen that all of Examples 1 to 10 are excellent in storage stability for 2 weeks or longer, and that migration resistance and storage stability can be compatible.

While the present invention has been described in detail and with reference to specific embodiments thereof, it is apparent to one skilled in the art that various changes and modifications can be made therein without departing from the spirit and scope of the invention. This application is based on the Japanese patent application (Japanese patent application No. 2017-020628) filed on Feb. 7, 2017, the contents of which are incorporated herein by reference.

The invention claimed is:

1. A photosensitive resin composition, comprising:
   a photosensitive prepolymer having a carboxyl group and an ethylenically unsaturated group;
   a photopolymerization initiator; and
   a thermosetting agent,
   wherein the thermosetting agent is a polycarbodiimide compound represented by the following Formula (1), in which carbodiimide group is protected by an amino group dissociating at a temperature of 80° C. or higher, and the polycarbodiimide compound having a weight average molecular weight of 300 to 3,000 and a carbodiimide equivalent of 150 to 600,

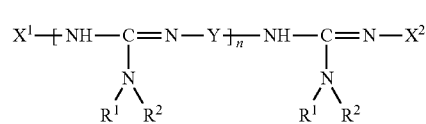
(1)

wherein, in Formula (1),
   $R^1$ and $R^2$ each independently represents a hydrogen atom, a linear or branched alkyl group having 1 to 6 carbon atoms, or a cycloalkyl group having 3 to 6 carbon atoms, $R^1$ and $R^2$ may be same as or different from each other, but both of them are not hydrogen atoms at the same time;
   $X^1$ and $X^2$ each represents —$R^3$—NH—COOR$^4$, $R^3$ being a divalent organic group having at least one aromatic group and $R^4$ being a residue obtained by removing a hydroxy group from an organic group having one hydroxy group, and $X^1$ and $X^2$ being same as or different from each other;
   Y represents —$R^5$—NHCOO—$R^6$—OCOHN—$R^5$—, each $R^5$ being independently a divalent organic group having at least one aromatic group and $R^6$ being a divalent organic group, but not being an ether bond; and
   n represents an integer of 1 to 5.

2. The photosensitive resin composition according to claim 1,
   wherein the carbodiimide of the polycarbodiimide compound has 2 to 5 functional groups.

3. The photosensitive resin composition according to claim 1, wherein the carbodiimide equivalent of the polycarbodiimide compound is 0.9 to 1.3 equivalents with respect to the carboxyl group of the photosensitive prepolymer.

4. The photosensitive resin composition according to claim 1, used for a solder resist film.

5. A solder resist film formed using the photosensitive resin composition according to claim 1.

6. A flexible printed circuit comprising:
an insulating layer;
a wiring pattern made of a conductive material and provided on the insulating layer; and
a solder resist layer provided on the wiring pattern,
wherein the solder resist layer is formed using the photosensitive resin composition according to claim 1.

7. The flexible printed circuit according to claim 6, further comprising:
a shield layer on the solder resist layer, the shield layer containing a conductive material,
wherein the flexible printed circuit keeps a resistance value of $1.0 \times 10^7 \Omega$ or more for 500 hours or longer while a voltage of 50 V is applied under an atmosphere of a temperature of 85° C. and a relative humidity of 85% RH when the solder resist layer is cured such that an interlayer distance between the wiring pattern and the shield layer after curing the solder resist layer be 10 μm.

8. An image display device, comprising the flexible printed circuit according to claim 6.

9. A flexible printed circuit, comprising:
a substrate including a wiring pattern;
a solder resist layer covering the wiring pattern; and
a shield layer provided on the solder resist layer,
wherein the solder resist layer contains an acylurea,
the shield layer is made of a conductive material, and
wherein an electrical insulation property of the flexible printed circuit satisfies a condition that a resistance value keeps $1.0 \times 10^7 \Omega$ or more for 500 hours or longer while a voltage of 50 V is applied under an atmosphere of a temperature of 85° C. and a relative humidity of 85% RH, when an interlayer distance between the wiring pattern and the shield layer after hot pressing is less than 20 μm.

\* \* \* \* \*